United States Patent

Belk

(10) Patent No.: US 6,324,493 B1
(45) Date of Patent: Nov. 27, 2001

(54) METHOD AND APPARATUS FOR MODELING ELECTROMAGNETIC INTERACTIONS IN ELECTRICAL CIRCUIT METALIZATIONS TO SIMULATE THEIR ELECTRICAL CHARACTERISTICS

(75) Inventor: Nathan R. Belk, Scotch Plains, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/283,392

(22) Filed: Apr. 1, 1999

(51) Int. Cl.[7] ................................................. G06F 17/50
(52) U.S. Cl. .................................. 703/13; 703/2; 703/4; 716/20
(58) Field of Search ............................. 703/2, 4, 5, 13, 703/14; 716/7, 19, 20

(56) References Cited

U.S. PATENT DOCUMENTS

| | | |
|---|---|---|
| 5,051,911 | 9/1991 | Kawasaki et al. . |
| 5,497,337 * | 3/1996 | Ponnapalli et al. ..................... 716/19 |
| 6,182,023 * | 1/2001 | Ohtsu et al. ............................ 703/5 |
| 6,185,517 * | 2/2001 | Ohtsu et al. ............................ 703/4 |

OTHER PUBLICATIONS

Belk et al., "The Simulation and Desing of Integrated Inductors", Proceedings 36th Design Automation Conference, pp. 988–993, Jun. 1999.*

Zheng et al., "A Model for Cylindrical Antennas in a Multilayer Medium", Proc. 27th Southeastern Symposium on System Theory, pp. 31–314, Mar. 1995.*

Feng et al., "An Approximate Analysis of Microstrip Lines with Finite Metallization Thicknes and Conductivity by Method of Lines", Proc. International Conf. on Microwave and Millimeter Wave Technology, pp. 1053–1056, Aug. 1998.*

Nazar et al., "Green's Function for Theoretical Model of an Aperature Fed Stacked–patch Microstrip Antenna", Digest Antennas and Propogation Society International Symposium, vol. 3, pp. 1104–1107, May 1990.*

* cited by examiner

*Primary Examiner*—Kevin J. Teska
*Assistant Examiner*—Douglas W. Sergent

(57) ABSTRACT

A so-called multipole decomposition is employed for modeling the charge and current distributions and the interactions of those distributions in metalization sub units arising from electrical signals in those metalization sub units. Specifically, a variable interaction range meshing, i.e., multipole, decomposition process is advantageously employed to model the charge and current distributions of metalization sub units. These distributions are then employed to obtain electrical characteristics of an overall physical metalization structure to be fabricated. In an embodiment of this invention, representative sections of metalization sub units are selected such as straight sections of infinitesimal length, right angle bends and intersections, and solved for the local short range charge and current interactions that determine their local distributions in those sub units. Then, components of the charge and current distributions are selected and separated based on the nature of their interactions with other circuit metalization sub units and the rate at which they can vary in the metalization structure. Only those interactions are retained that can significantly impact the overall metalization structure characteristics and only evaluate those interactions with other metalization sub units during intervals during which those interaction components are capable of changing.

33 Claims, 5 Drawing Sheets

MULTIPOLE MESHING TECHNIQUE

PATHS AND LOOPS OF CURRENT OR CHARGE $1/r$ INTERACTION
$1/r^3$
$1/r^2$

TRADITIONAL MESHING

PATCHES OF CURRENT OR CHARGE

784 $1/r$ INTERACTIONS

200

200

200

200

METHOD AND APPARATUS FOR MODELING ELECTROMAGNETIC INTERACTIONS IN ELECTRICAL CIRCUIT METALIZATIONS TO SIMULATE THEIR ELECTRICAL CHARACTERISTICS

RELATED APPLICATIONS

U.S. patent application Ser. Nos. 09/283,393, 09/283,394 and 09/283,395 were filed concurrently herewith.

TECHNICAL FIELD

This invention is related to the design of optimized metalization structures and, more particularly, to modeling of electromagnetic interactions in electrical circuit metalization sub units to simulate the electrical properties of metalization structures in integrated circuits from their physical characteristics and using those electrical properties to obtain improved metalization performance.

BACKGROUND OF THE INVENTION

It is desirable to be able to model quickly and accurately the electrical characteristics of metalization structures, such as inductors, interconnects and the like. Determination of these electrical characteristics requires a detailed solution of the charge and current densities everywhere in the metalization structure combined with an understanding of the extent to which time dependent variations in the charge and current densities will generate unwanted variations in the charge and current densities elsewhere. Because of the very rapid three (3) dimensional variation in charge and current densities with position in known metalization structures, because these variations strongly affect the electrical characteristics of the metalizations, and because the variations can arise from variations in distant metalization structures, an accurate and fast method for determining those charge and current distributions and the interactions between those charge and current distributions is required in order to properly determine the electrical properties of, for example, inductors or other systems of metals. One family of techniques that has been used for this purpose, employs a uniform or variable three (3) dimensional mesh of the entire metalization structure and assumes that the charge and current distributions will be strongly determined by interactions with adjacent metalization structures at all distances. However, these so-called long range solvers are very inefficient, i.e., slow, when employed in an attempt to model metalization structures that are largely planar as in integrated circuit metalization structures or that are strongly shielded from distant structures or that are physically small as compared to the wavelength of the electrical signals. Another family of techniques employs a very coarse mesh to reduce the number of interactions that must be incorporated in the solution. These solvers are faster in yielding results than the prior family but do not account for the strong short range variations and interactions in the charge and current densities that are very important in order to accurately model the metalization structure to be fabricated.

SUMMARY OF THE INVENTION

These and other problems and limitations of prior known modeling and design arrangements and techniques are overcome by employing a so-called multipole decomposition for modeling the charge and current distributions and the interactions of those distributions in metalization sub units arising from electrical signals in those metalization sub units.

Specifically, a variable interaction range meshing, i.e., multipole, decomposition process is advantageously employed to model the charge and current distributions of metalization sub units. These distributions are then employed to obtain electrical characteristics of an overall physical metalization structure to be fabricated.

In an embodiment of this invention, representative sections of metalization sub units are selected such as straight sections of infinitesimal length, right angle bends and intersections, and solved for the local short range charge and current interactions that determine their local distributions in those sub units. Then, components of the charge and current distributions are selected and separated based on the nature of their interactions with other circuit metalization sub units and the rate at which they can vary in the metalization structure. Only those interactions are retained that can significantly impact the overall metalization structure characteristics. Then, only evaluate those interactions with other metalization sub units during intervals in which those interaction components are capable of changing.

DETAILED DESCRIPTION

Figure 1B:
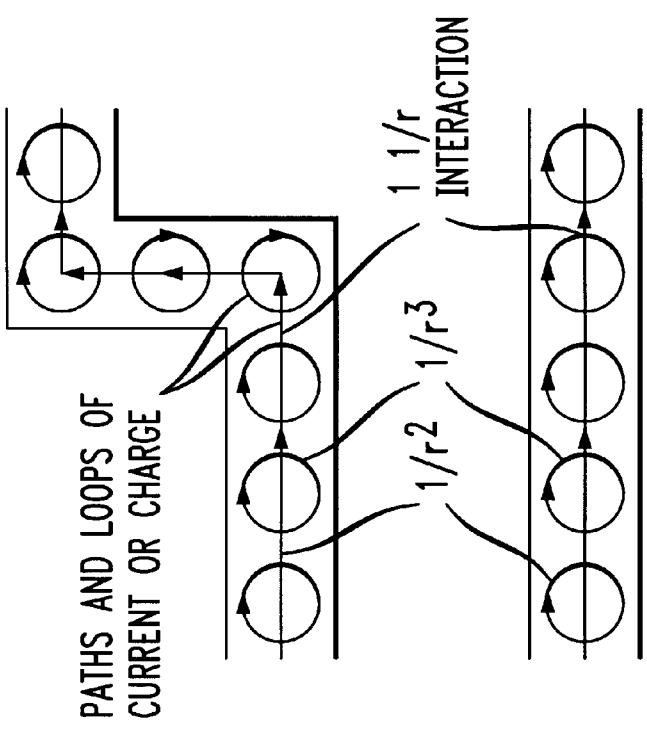
FIG. 1B shows, in simplified form, the decomposition of circuit metals into complex sub distributions of charge and current and the spatial dependence of coupling of those distributions to other distributions.
Figure 1A:
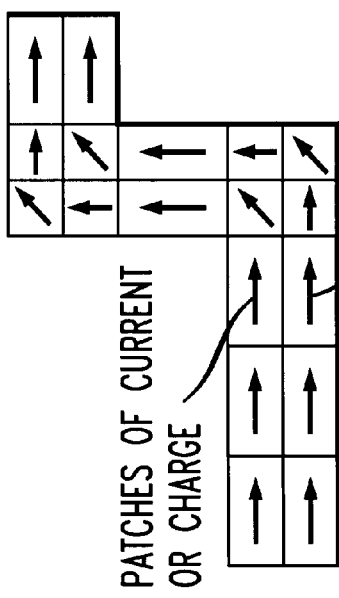
FIG. 1A shows, in simplified form, the prior known decomposition of circuit metals into patches of charge and current and the spatial dependence of coupling of those patches to other patches.

FIG. 1A shows, in simplified form, the prior known decomposition of circuit metals into patches of charge and current and the spatial dependence of coupling of those patches to other patches. Specifically, use of the patch charge and current meshing technique generates a large number of long-range $1/r$ interactions ($r$ is the distance between interactions), and very long computational times in simulating the metals system characteristics. Indeed, in the traditional meshing technique the number N of $1/r$ interactions grows significantly faster than the decay in interactions, thereby significantly increasing the time to arrive at a solution of the metals system (~NLogN).

FIG. 1B shows, in simplified form, the decomposition of circuit metals into complex sub distributions of charge and current and the spatial dependence of coupling of those distributions to other distributions. Specifically, for metal thickness, metal widths, and oxide thickness that are relatively small as compared to the electrical signal wave length, for example, $\lambda_{rf}$~10 cm, multipole meshing significantly reduces the number of independent $1/r$ interactions and, in this example, to one (1) $1/r$ interaction.

Briefly, the variable interaction range, i.e., multipole, meshing, decomposition process may be employed to model the charge and current distributions of metalization sub units because of certain characteristics of the metalization sub units. In particular, for metalization sub units that are small compared to the wave lengths of the electrical signals they carry, current in the overall metalization structure is virtually constant, the fields it generates are smoothly varying and the interactions of those fields with distant metalization structures can be readily represented. Developed potentials are also uniform and slowly varying along the metalization sub units and because of substrate screening, i.e., grounding, tend to fall off very rapidly with distance. See for example, U.S. patent application Ser. No. 09/283,395, filed concurrently herewith, for a substrate screening, i.e., grounding, arrangement that may advantageously be employed in practicing this invention. Specifically, the grounding, i.e., shielding, technique shunts current to ground potential thereby minimizing long range interactions caused by charge distributions in sub units of the metalization structure. However, both charge and current vary strongly within the metalization sub units due to strong short-range three (3) dimensional interactions. These characteristics of metalization sub units that are small compared to the wave lengths of the electrical signals can be efficiently incorporated in design and simulation processes through the variable interaction range meshing process.

For metalization structures, for example, inductors or the like, fabricated on integrated circuit conductive substrates, a large component of the magnetic fields arising from the metalization currents are reflected from the conductive substrate at a phase shifted from that of the incident phase. The electric fields resulting from this component of the magnetic field are at a phase shift of $\sim\pi/4$ with respect to the inductor current, and, as a result, they contribute both a correction to the inductance and to the dominant component of the series resistance at microwave frequencies. In order to accurately model the characteristics of these inductors, it is necessary to accurately determine the magnitudes and phases of the electric fields arising from the interactions of microwave currents with the integrated circuit substrates, and to integrate those fields over the circuit metals. Below, the modeling of integrated inductors on conductive substrates is described; however, the described formalism can be used to accurately predict all electromagnetic interactions occurring between integrated circuit elements on integrated circuit substrates.

Formalism

In order to model the characteristics of integrated circuit metalization structures, a formalism is needed that accurately describes the electrical characteristics of the metalization structures. In weakly interacting systems of metals at low frequencies many effective techniques have been developed in attempts at solving this problem. However, at high frequencies and for metalizations whose thickness approaches their widths, these known techniques yield inaccurate results because they fail to account for the complex three (3) dimensional charge and current distributions on metalizations. Indeed, because the effects of the integrated circuit substrates on inductor fields are slowly varying functions of position, the inductor series resistances and inductances can be determined by using these methods and, then, the substrate effects are superimposed on them.

In what follows, the determination for the characteristics of the electric field generated by a point current source located in the metal stack of an integrated circuit wafer is described. The resultant electric field is divided into two components: (1) the field from a static or time invariant point source of current or charge without substrate interactions, and (2) the effects of the substrate on those fields. Then, the electrical characteristics of the overall metalization structure are determined by decomposing the metalization structure into sub units, determining the electrical characteristics of the sub units and, then, assembling the overall metalization structure from the sub units whose characteristics have been determined. Note that in both the determination of the electrical characteristics of the sub units and the determination of the overall metalization structure, the determination process starts with a static determination on the metals and, then, the substrate interactions are superimposed on that determination.

The potential $\Phi$, describing the radiation arising from a point current source of frequency f at a vector/separation between the point current source and an observation point of r=0, is given as the solution to the inhomogeneous Helmholz wave equation:

$$\left[\nabla^2 + \frac{(2\pi f)^2}{c^2}\right]\Phi(r, f) = \delta(r), \qquad (1)$$

where c is the speed of light in the media. The electric field generated by this current element is:

$$E(r) = 2\pi i f \mu_0 \left(\bar{I} + \frac{\nabla \nabla}{k^2}\right)\Phi, \qquad (2)$$

where $k=2\pi f/c$, $\bar{I}$ is the identity matrix and, again, r is the vector/separation between the point current source and the observation point.

The derivatives on the right of Equation 2 describe the electric field from the scalar potential, while $\bar{I}$ determines the component arising from the vector potential. For example, for a metal sub unit 100 $\mu$m in length, the component of the electric field from the scalar potential $[O(1/r^3)]$ will be many orders of magnitude larger than that from the vector potential $[O(1/r)]$ and will complicate the accurate evaluation of the component arising from the vector potential. However, because of the small size of the sub unit, the component of the electric field arising from the scalar potential will result in a displacement current variation parallel to that sub unit that is orders of magnitude smaller than the current through that sub unit. Further, because the time dependent magnetic field arising from this displacement current does not couple strongly to the metalization sub unit, the fields arising from the displacement current are not important for sub units of dimensions $<f/(10c)\sim1$ cm. For these reasons, only the component of the electric field arising from the vector potential is retained in Equation 2, and the effects of the scalar potential are treated through the determination and incorporation of metalization capacitances, as discussed below.

In inhomogeneous planar media, the form for the electric field in Equation 2 is inconvenient; therefore, it is advantageous to use Somerfeld's identity for the determination of the potentials, namely:

$$\Phi(r, k) = i' \int_0^\infty dk_\rho \frac{k_\rho}{k_z} J_0(k_\rho \rho)\left[e^{ik|z-z'|} + A_+ e^{-ik_z z} + A_- e^{ik_z z}\right], \qquad (3)$$

where $i'=\sqrt{-1}$, $z'$ is the height of the source, $A_+$ is the complex amplitude of the waves reflected from above, and $A_-$ is the amplitude of the waves reflected from below the metalizations.

Equation 3 decomposes the spherically symmetric form for the electric field into an integral over evanescent and traveling waves($e^{ik_z|z|}$) in the $\hat{z}$ direction and cylindrically symmetrical waves[$J_0(k_\rho\rho)$] in the $\hat{\rho}$ direction with $k^2=k_\rho^2+k_z^2$. For integrated circuit substrates, the wave propagation in the $\hat{z}$ direction is determined by the reflection and transmission coefficients at each dielectric interface that are determined by the frequency dependent dielectric constants of each layer. As discussed, for the integrated circuit process, $A_-$ will be dominated by the electric fields reflected from the conductive substrates. With the determination of $A_+$ and $A_-$, the potentials are determined from a point current in the vicinity of the substrate. Using Equation 3, the electric fields can be determined at all places in the metalization stack arising from currents anywhere in the metal stack of the integrated circuit wafer.

With the determination of $A_+$ and $A_-$, Green's function is determined, which relates the electric field $E(\rho,z)$ and electric (scalar) potential $\Phi(r,k)$ to the current dipole $\hat{x}I(\rho',z')dl$ for the integrated circuit substrate, and are expressed (or it may be desirable to remove several images, especially for the scalar potential, or solve for A in the limit of infinite substrate conductivity) in the following form:

$$E(\rho, z) = \hat{x}I(\rho', z')dl \frac{if}{\epsilon_0 c^2} \int_0^\infty k_\rho G \cdot J(k_\rho\rho)dk_\rho, \text{ and} \quad (4)$$

$$\Phi(r, k) = \frac{1}{2\pi\epsilon}\int_0^\infty k_\rho dk_\rho Gs\rho \cdot J_0(k_\rho\rho). \quad (5)$$

Application of Green's Function for Circuit Modeling

As discussed, the forms for the electric field in Equation 4 and the electric potential in Equation 5 are inconvenient because the integrals therein converge slowly and E diverges as $1/\rho$ for small $\rho$, making the evaluation of the self induced electric fields difficult. The divergence can be removed by observing that:

$$\frac{1}{2}\int_0^\infty J_0(k_\rho\rho)dk_\rho = \frac{1}{\rho}. \quad (6)$$

As a result, the electric field at($\rho,z$) and the electric (scalar) potential at ($\rho,z$) arising from a point current source at($\rho',z'$) can be written as:

$$\overline{E}(\rho, z) = I(\rho', z') \quad (7)$$
$$\frac{if \cdot \overline{dl}}{\epsilon_0 c^2}\left[\int_0^\infty \left(k_\rho G(z, z') - \frac{1}{2}\right)J_0(k_\rho|\rho - \rho'|)dk_\rho + \frac{1}{2|\rho - \rho'|}\right], \text{ and}$$

$$\Phi(r, k) = \quad (8)$$
$$\frac{1}{2\pi\epsilon}\left[\int_0^\infty \left(k_\rho Gs\rho(z - z') - \frac{1}{2}\right) \cdot J_0(k_\rho|\rho - \rho'|)dk\rho + \frac{1}{2|\rho - \rho'|}\right],$$

respectively.

The second term in the square brackets on the right of Equation 7 is Neuman's Equation for the electric fields generated by current carrying elements in free space with dimensions that are much less than the wavelength of light at zero (0) frequency. The integral on the right side of Equation 7 is dominated by the induced substrate currents and describes the difference between an ideal inductor and an inductor fabricated on an integrated circuit process. Because the skin depth in the integrated circuit substrate is >200 $\mu$m, the fields arising from the substrate coupling are a slowly varying function of $\rho$ and can be evaluated at intervals of $\rho$~5 $\mu$m and at frequencies of ~0.5 GHz. These frequency and position dependent values are stored in an array $\Theta_{f,\rho}$ that is used as a look up table for inductor calculations.

The second term in the square brackets of the right of Equation 8 is the equation for the potential generated by a point charge in a uniform dielectric at zero (0) frequency. The integral on the right side of Equation 8 is dominated by the induced surface charge that resides at the boundary between the conductive substrate and the insulating oxides. Because the oxide thickness in the integrated circuit is >1 $\mu$m, the fields arising from the substrate coupling in the scalar potential are more rapidly varying functions of $\rho$ and for small inter element separation needs to be evaluated at intervals of $\rho$~1 $\mu$m and at frequency intervals of ~0.5 GHz. These frequency and position dependent values are stored in an array $\Theta_{f,\rho}$ that is used as a look up table for inductor calculations. It is often convenient to subtract two images from the scalar potential Green's function in Equation 8, this reduces the size of $\Theta_{f,\rho}$ but increases the complexity of the static potential calculations discussed below.

Basis Function Determination of Metalization Impedances and Admittances

In what follows, it is shown how basis functions in conjunction with Equation 7 and Equation 8 can be used to create a complex mutual and self-inductance matrix, as well as, the quasi static inter metal capacitance matrix fully accounting for substrate interactions. These processes can be employed alone or in combination with traditional simulation processes to determine complex metalization structures.

The metalization structure to be fabricated is decomposed into paths of electrical conductivity and those paths are decomposed into a system of straight polygons, 45 or 90 degree bends and 90 degree intersections of constant cross section. The resulting structures, referred to as sub units, are categorized according to whether or not their cross sections match the cross sections of other sub units. All sub units with the same cross section and performing the same function, e.g., 45 degree bends, are referred to as repeated sub units and are represented with the same basis function, in a manner described below. Sub units whose function or cross section is not repeated are referred to as non-repeated and are represented by different basis functions. Both the repeated and non-repeated sub units are decomposed into sets of significantly smaller sized elements than the sub units.

The determination of the electrical characteristics of an integrated circuit inductor is used to outline this procedure. In order to calculate the series self and mutual impedances of the sub units, as well as, inter sub unit and sub unit to substrate admittances necessary to describe an integrated circuit inductor; representative sub units are selected from that inductor. Each of the sub units is then broken down into an array of short and long metal elements or paths that carry a current or charge distribution that must be determined. FIGS. 2B and 2C show an inductor, the sub units selected from it, and the sub elements within the sub units. In this example, for purposes of illustration, three (3) sub units are denoted as being in a group. Indeed, any desired number of sub units may be incorporated into groups depending on the application of the invention. As shown in FIG. 3, on or near each of the current or charge carrying elements is a test element" which spans the region between the dots on each of the current or charge carrying elements. There are two methods by which the basis functions for this type of structure can be constructed. In strongly coupled structures, such as inductors, it is often advantageous to determine groups of sub units self consistently. Thus, in the inductor shown in FIGS. 2B and 2C, the three sub units in a group can be solved simultaneously or independently. The differences between the two methods will be discussed below. Although the elements in FIGS. 2B and 2C are depicted in two dimensions in the material presented below, it is assumed that they are arrayed in three dimensions. In what follows, test elements are used which are smaller than the charge or current carrying elements, however, this is not generally required. The field or potential on each of the test elements arising from the current or charge on the longer elements is determined by the sum of two components. The first component, the self induced field and potential of a sub unit element of radius $\rho$ whose endpoints are offset by the distances $x_{a,b}=x_{i,a}-x_{j,b}$ in the direction parallel to their lengths are determined by:

$$ms_{i,j} = \frac{\mu_0}{2\pi}\sum_{a=-1}^{1}\sum_{b=-1}^{1}(-1)^{1+b}\cdot\left[\frac{(\rho^2+x_{i,j})^{3/2}+|x_{i,j}|^3}{3\rho^2}+\frac{|x_{i,j}|}{2}\cdot\log\left(\frac{2\cdot x_{i,j}}{\rho}\right)\right], \tag{9}$$

and $$\Phi s_{i,j} = \frac{1}{2\pi\epsilon}\sum_{a=-1}^{1}\sum_{b=-1}^{1}(-1)^{1+b}\cdot\left[\frac{(\rho^2+x_{i,j})^{3/2}+|x_{i,j}|^3}{3\rho^2}+\frac{|x_{i,j}|}{2}\cdot\log\left(\frac{2\cdot x_{i,j}}{\rho}\right)\right], \tag{10}$$

respectively, where the origin of the coordinate system has been chosen such that $$\sum_{a,b=\pm 1} x_{a,b} = 0.$$

The zero frequency metal resistance of a test element is given by:

$$rs_i = \frac{\ln_i}{w_i} Rsq, \tag{11}$$

where Rsq is the metal resistance in ohms per square, $w_i$ is the width and $\ln_i$ is the length of the test element.

The second component, arising from the coupling of test elements to adjacent lines of current or charge or charge images that are separated from the test element can be determined by:

$$m_{i,j} = \frac{1}{4\pi\epsilon_0 c^2}\int_0^{l_i}\int_0^{l_j}\frac{1/r}{|\vec{r}_i-\vec{r}_j|}d\vec{l}_i\cdot d\vec{l}_j, \text{ and} \tag{12}$$

$$\phi_{i,j} = \frac{1}{4\pi\epsilon}\int_0^{l_i}\int_0^{l_j}\left[\frac{1}{|\vec{r}_i-\vec{r}_j|}-\frac{1}{|\vec{r}_i-\vec{r}_j-2z\hat{z}|}\right]d\vec{l}_i\cdot d\vec{l}_j, \tag{13}$$

where $\vec{r}$ is the location of the observation point, $\vec{r}_j$ is the location of the source and z is the height of the source. In Equation 13, the second term in the brackets enforces the condition of infinite substrate conductivity. Additionally, the first term in the brackets is charge and the second term is counter charge. Consequently, the importance of the $1/r$ interactions is significantly reduced.

The component of the electric field and potential arising from the substrate interactions can be determined through the following equations 14 and 15, respectively:

$$z_{i,j} = \sum_0^{\frac{Ln_j}{\Delta l_j}}\sum_0^{\frac{Ln_i}{\Delta l_i}}\Theta_{f,\rho}\overline{\Delta l_i}\cdot\overline{\Delta l_j}, \text{ and} \tag{14}$$

$$\varphi_{i,j} = \sum_0^{\frac{Ln_j}{\Delta l_j}}\sum_0^{\frac{Ln_i}{\Delta l_i}}\Phi_{f,\rho}\overline{\Delta l_i}\cdot\overline{\Delta l_j}. \tag{15}$$

where the $\Theta_{f,\rho}$ are coefficients from the substrate coupling matrix, the vectors $\overline{\Delta l_i}$ and $\overline{\Delta l_j}$ are the summation intervals, $\rho$ is the separation between the centers of the summation intervals, and the summations are over every sub unit in the inductor including its input and output leads. The series impedances described in Equations 9, 11, 12 and 14 are combined in the form:

$$\delta v_i = (2\pi i f m s_{i,i} + rs_i + z_{i,i})I_i + 2\pi i f \sum_{j\neq i} I_j(m\rho_{i,j}+mn\rho_{i,j}+z_{i,j}), \tag{16}$$

where $\delta v_i$ is the voltage across the $i^{th}$ metalization test element arising from the currents in each of the $j^{th}$ sub units. If the impedances for all three (3) sub units are determined simultaneously, Equation 18 will run over all current elements in the three sub units. If the impedances for the three sub units are determined independently, Equation 16 need not include terms for more than one sub unit as its impedances are being determined.

The $\delta v_i$ are generally taken to be the same for all parallel test elements even in the presence of fields from other current carrying metalization sub units. Since, it is necessary to find the physical characteristics of the sub unit in an external electric field arising from the currents in other sub units, a multipole expansion is performed on the interaction and the effect of external electric fields can be added to the left of Equation 16 through terms of the form:

$$E(x_0)+\frac{\partial E}{\partial x}\cdot 2\frac{(x-x_0)}{ws}+\frac{\partial^2 E}{\partial x^2}\cdot\left(6\frac{(x-x_0)^2}{ws^2}-\frac{1}{2}\right)+\ldots, \tag{17}$$

where x is taken to be along the line which intersects the end of each of the parallel test elements, $x_0$ is at the center of the sub unit, ws is the width of a particular sub unit and adjustments are made to the magnitude of the electric field, E, and its derivatives. Additionally, simply stated, the effect of $E(x_0)$ is to cause an increased potential or increased current flow through the metalization structure. Because $\lambda\gg$ than the physical dimensions of the metalization structure, these increases in current will occur over the entire length of the metalization structure and this current can be taken as a constant over the metalization structure. (Note that $\lambda$ is the wave length of an electrical signal on the metalization structure.) Moreover, these increases in current produce a long-range $1/r$ interaction so they will strongly affect objects even at significant distances from the metalization sub unit. The effect of $$\frac{\partial E}{\partial x}\cdot 2\frac{(x-x_0)}{ws}$$

is to cause single circulating eddy currents to flow in the metalization structure. These eddy currents will dissipate energy and add resistance to nearby metalization structures.

Fortunately, they are short range and need not be considered when determining the characteristics of the distant metalization structures. The effect of $$\frac{\partial^2 E}{\partial x^2} \cdot \left(6\frac{(x-x_0)^2}{ws^2} - \frac{1}{2}\right)$$

is to cause pairs of counter rotating eddy currents to flow in the metalization structure. These eddy currents are very short range and can usually be discounted in the self-consistent determination of characteristics of metalization structures, except when the width of the metalization structure in very wide their effects can be "back" calculated after the characteristics of the metalization structure have been determined.

Because the wavelengths of the electrical signals ($\geq 3$ cm) are much longer than a typical integrated circuit chip dimension, for most applications, the external E-fields in Equation 17 can be approximated as arising from excitation currents in the overall metalization structure whose distributions are invariant across the widths of their metalization sub units. In this situation, it is possible to determine the sub unit current distributions in the E-fields from a uniform current in all structures outside of the regions of the current carrying elements described in Equation 16. Finally, large sub units of a metalization structure can be excited independently to determine the interactions between those sub units. In structures such as the inductor shown in FIGS. 2B and 2C, each turn, including its sub unit, can be excited with a current independently, the three sub units can be solved for each excitation, and the sub unit current distribution and electrical properties can then be determined as a function of their self and adjacent turn currents.

For structures lacking the symmetry of the structure shown in FIGS. 2B and 2C, it is often desirable to solve Equations 16 and 17 independently for each significant term in the electric field expansion (Equation 17) so that the field dependence of the sub unit current distribution and its resulting electrical properties can be quantified. Following this procedure, in the determination of the overall metalization structure the effects of the field dependence of a sub unit current distribution will be accurately represented.

Because the sub units are small compared to the wavelength of the electrical signal, the sum of the currents in the elements is roughly constant so that the current entering a given sub unit is the same as that exiting the sub unit. This constraint is implemented for sub units being excited through requiring that:

$$\Sigma I_j = 1. \tag{18}$$

For sub units that are not excited, the constraint is:

$$\Sigma I_j = 0. \tag{19}$$

As described above, the simultaneous solution of Equations 16 and 17 along with constraints of Equations 18 and 19 allow the determination of the field dependent current distribution of the sub unit.

In order to determine the electrical characteristics of the sub unit, use is made of the current distribution on the sub unit along with the voltage difference ($\delta v_i$) on the left of Equation 16.

The complex in the field sub unit impedance is determined by the sub unit voltage differences $\delta v_i$ divided by the sub unit current, namely:

$$Z_{i,j} = \frac{\delta v_i}{I_j}. \tag{20}$$

The mutual interactions between two sub units, for example, A and B, can be determined through $$M_{A,B} = \sum_i \sum_j (m\rho_{i,j} + mn\rho_{i,j})I_{A,i} \cdot I_{B,j}, \tag{21}$$

where the $I_i$ and the $I_j$ are the currents on the $I^{th}$ and $J^{th}$ sub elements of the $A^{th}$ and $B^{th}$ sub units, respectively.

A more efficient manner for the determining and expressing the mutual interactions between sub units is through multipole decomposition. In this process, the current distributions on the sub units are decomposed into mathematically orthogonal distribution functions that efficiently capture the differing properties of the components of the current distributions. These current distribution functions generate electric fields whose spatial dependence is stored in a look up table, and these electric fields can then be used to determine the couplings of the adjacent sub units. Following this procedure, the most convenient current distribution functions are $$f_n = 1, x, \frac{3x^2}{2} - 1/2, \ldots.$$

The magnitude of the component $a_n$ of each of the $f_n$ in a sub unit current distribution is:

$$a_n = \frac{2n+1}{N} \sum_{i=0}^{N-1} f_n\left(\frac{2i-N+1}{N-1}\right) \cdot I_i, \tag{22}$$

where $a_n$ then represents the component of the function $f_n$ in the sub unit current distribution. The electric field generated by $a_n$ is given by:

$$E_n(2\rho/w, \theta) = \frac{if\mu_0 N}{2w} \cdot \int_{-1}^{1} \frac{a_n f_n\, dx}{(\rho^2 + 2\rho x\cos\theta + x^2)^{1/2}}, \tag{23}$$

where w is the width of the sub units, $\rho$ is the distance to the center of the distribution being represented and $\theta$ is the angle between the current flow and line between the point current source and observation points. Because these E-fields also determine the mutual inductances between sub units, these solutions permit the full determination of the series impedances of the overall metalization structure.

A method for determining the variation of the sub unit self and mutual electrical properties that arise from variations in sub unit length is to decompose a sub unit of perturbed length into the sum of the original sub unit plus a short physical extension to the sub unit. The self and mutual electrical characteristics of the sub unit extension can be determined through substitution of the previously determined sub unit current distribution (found through Equation 18) into Equations 9, 11, 12 and 23 that describe the self and mutual interactions between current elements that represent the sub unit extension.

In order to determine the overall system of series impedances it is necessary to first assemble the overall system from the determined sub units, determine the coupling between the sub units, and tabulate these properties with their self-impedances.

The component of the induced fields between the metalization structure sub units arising from the substrate interactions can be determined through the effective mutual and self impedances generated by the substrate coupling, through the use of the following equation:

$$Z_{i,j} = \sum_0^{\frac{Ln_j}{\Delta l_j}} \sum_0^{\frac{Ln_i}{\Delta l_i}} \Theta_{f,p} \overline{\Delta l_i} \cdot \overline{\Delta l_j}, \quad (24)$$

where the $\Theta_{f,p}$ are coefficients from the substrate coupling matrix, the vectors $\overline{\Delta l_i}$ and $\overline{\Delta l_j}$ are the summation intervals, $\rho$ is the separation between the centers of the summation intervals, and the summations are over every sub unit in the inductor including its input and output leads. The series impedances described in Equations 13 through 20 are combined in the form:

$$V_i - V_{i-1} = (Zs_{i,i} + Z_{i,i})I_i + 2\pi i f \sum_{j \neq i} I_j(M_{i,j} + Zs_{i,j}), \quad (25)$$

where $V_i - V_{i-1}$ is the voltage across the $i^{th}$ metal sub element arising from the currents in each of the $j^{th}$ sub units and the $M_{i,j}$ in Equation 25 are determined from the $a_n$ in Equation 22 and $E_n$ of Equation 23.

In order to determine the complex admittance matrix for the metalization structure, the potentials described in Equations 10, 13 and 15 are combined in the form:

$$\phi_j = (\phi s_{i,j} + \phi s b_{i,j})q_j + \sum_{i \neq j} q_i(\phi \rho_{i,j} + \phi n \rho_{i,j} + \phi s b_{i,j}). \quad (26)$$

If all three (3) sub units are solved simultaneously, Equation 26 will run over all charge elements in the three sub units. If the sub units are solved independently Equation 28 need not include terms from more than one sub unit as it is being solved.

The $\phi_j$ are generally the same for all parallel test elements. It is often necessary to find the physical characteristics of the sub units in the external electric potential arising from the charges in other sub units. These external potentials can be added to the left of Equation 28 through terms of the form:

$$\Phi(x_0) + \frac{\partial \Phi}{\partial x} \cdot 2 \frac{(x - x_0)}{ws} + \frac{\partial^2 \Phi}{\partial x^2} \cdot \left(6 \frac{(x - x_0)^2}{ws^2} - \frac{1}{2}\right) + \ldots, \quad (27)$$

where x is taken to be along the line which intersects the end of each of the parallel test elements, $x_0$ is at the center of the sub unit, ws is the width of a particular sub unit are made to the magnitude of the potential $\Phi$ and its derivatives. Unlike the metalization currents, there can be significant variation in magnitude of the charge along the length of the metalization sub unit, consequently, additional terms can be added to Equation 27 to account for these variations. Note, however, that these variations tend to be limited by the screening effects of the substrate.

In structures such as the inductor shown in FIGS. 2B and 2C, the sub unit in each turn can be excited with a voltage independently, the three sub units can be solved for each excitation, and the sub unit charge distribution and electrical properties can then be determined as a function of their self and adjacent turn voltages.

For structures lacking the symmetry of the structure in FIGS. 2B and 2C, it is often desirable to solve Equations 26 and 27 independently for each significant term in the electric potential expansion (Equation 27) so that the dependence of the sub unit charge distribution and, therefore, its electrical properties on the potential or its derivatives can be quantified. Then, in the determination of the overall metalization structure, the effects of the field dependence of a sub unit charge distribution will be accurately represented as it responds to the potential variations generated by the charge distributions in other system sub units.

Because the sub units are small compared to the wavelength of the electrical signal, voltages of the elements in and connected to the sub units is roughly constant so that the whole structure can be assigned a constant voltage during its determination. This constraint is implemented for sub units being excited through requiring that:

$$\phi_i = 0.1. \quad (28)$$

For sub units that are not being excited, the constraint is:

$$\phi_i = 0. \quad (29)$$

As described above, the simultaneous solution of Equations 26 through 29 allows the field dependent charge distribution of the sub unit to be obtained.

In order to determine the characteristics of the sub unit, the charge distribution on the sub unit is used, as well as, the difference between the sub unit voltage $\phi_i$ on the left of Equation 26 and that of adjacent structures. The complex in field sub unit admittance is determined by the total sub unit charge divided by the sub unit voltage, namely:

$$Y\rho_{i,j} = \frac{qtot_i}{\phi_j}, \quad (30)$$

where $qtot_i$ is the sum of the charge on the region of the charge carrying elements spanned by the test elements.

The mutual interactions between two sub units, for example, A and B, can be determined through:

$$C_{A,B} = \sum_i \sum_j (\phi \rho_{i,j} + \phi n \rho_{i,j} + \phi s b_{i,j})q_{A,i} \cdot q_{B,j}, \quad (31)$$

where the $q_{A,i}$ and the $q_{B,j}$ are the charges on the $A^{th}$ and $B^{th}$ sub units, respectively.

A more efficient manner for the determining and expressing the mutual interactions between sub units is through multipole decomposition. In this process, the charge distributions on the sub units are decomposed into mathematically orthogonal distribution functions that efficiently capture the differing properties of the components of the charge distributions. These charge distribution functions generate potentials whose spatial dependence is stored in a look up table, and these spatial dependent potentials can then be used to determine the couplings of the adjacent sub units. Following this procedure, the most convenient current distribution functions are $$f_n = 1, x, \frac{3x^2}{2} - 1/2, \ldots.$$

The magnitude of the component $a'_n$ of each of the $f_n$ in a sub unit charge distribution is:

$$a'_n = \frac{2n+1}{N} \sum_{i=0}^{N-1} f_n\left(\frac{2i-N+1}{N-1}\right) \cdot q_i, \tag{32}$$

where $a'_n$ then represents the component of the function $f_n$ in the sub unit charge distribution. The potential generated by $a'_n$ is given by:

$$\Phi(\rho/w, \theta) = \frac{N}{4\pi\epsilon w} \tag{33}$$
$$\int_{-1}^{1} \left(\frac{1}{(\rho^2 + 2\rho x\cos\theta + x^2)^{1/2}} - \frac{1}{(\rho^2 + 2\rho x\cos\theta + x^2 + 4z^2)^{1/2}}\right) \cdot$$
$$a'_n f_n dx,$$

where w is the width of the sub units, ρ is the distance to the center of the distribution being represented and θ is the angle between the charge flow and line between the point current source and observation points. Because these potentials also determine the mutual admittances between sub units, these solutions permit the full determination of the parallel admittances of the overall metalization structure.

A method for determining the variation of the sub unit self and mutual electrical properties that arise from variations in sub unit length is to decompose a sub unit of perturbed length into the sum of the original sub unit plus a short physical extension to the sub unit. The self and mutual electrical characteristics of the sub unit extension can be determined through substitution of the previously determined sub unit charge distribution (found through Equation 26) into Equations 10, 13 and 15 that describe the self and mutual interactions between charge elements that represent the sub unit extension.

The parallel metalization self and mutual admittances of the overall metalization structure are determined through the suitable combination of the representative sub units to form the larger structure and the tabulation of their characteristics and interactions when assembled into the larger structure in the following form:

$$I_{j-1} - I_j = V_j Y \rho_j + 2\pi i f \sum_{i \neq j} (V_j - V_i) C_{i,j}. \tag{34}$$

In Equation 34, $I_{j-1}-I_j$ represents currents that are derived from the series paths through parallel impedances. In Equation 34, the $Y\rho_j$, describing the capacitive and resistive admittances to a grounded substrate are much more important than the $C_{i,j}$, that describe the inter sub unit capacitances $$C_{i,j} = \sum_n \Phi_n(\rho/w, \theta).$$

The series impedances in Equation 25 are combined with a set of linear equations describing the parallel admittances of Equation 34 and the resulting system of equations (Equations 25 and 34) is solved for the two (2) port frequency dependent network admittances.

Figure 2A:
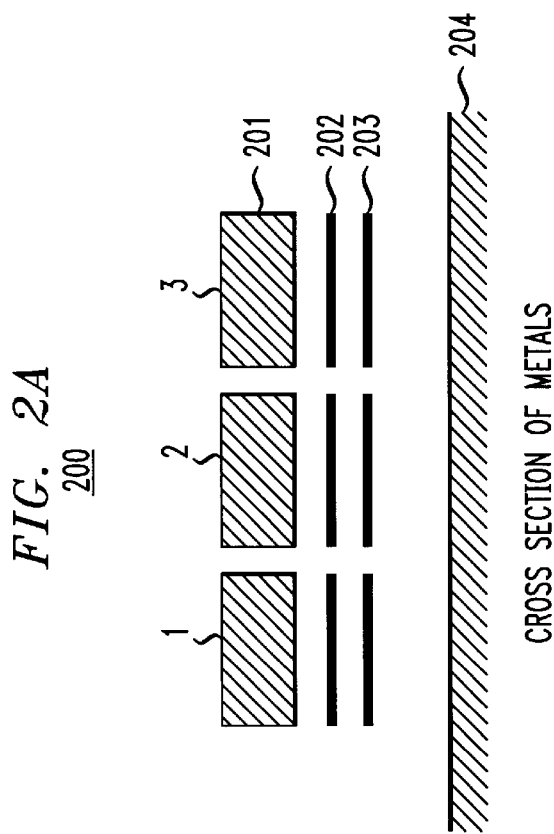
FIGS. 2A through 2C show, in simplified form, an inductor to be fabricated from circuit metalizations, as well as, the cross section of the metalization paths in the inductor.
Figure 2B:
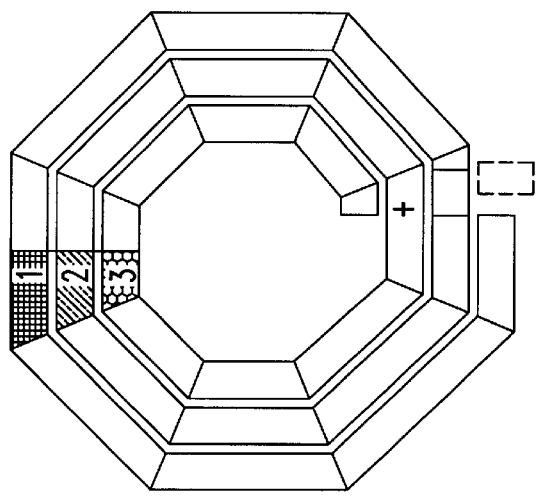
Figure 2C:
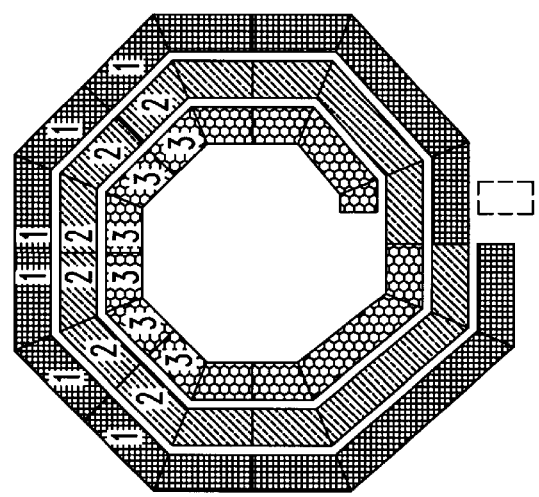
Figure 3:
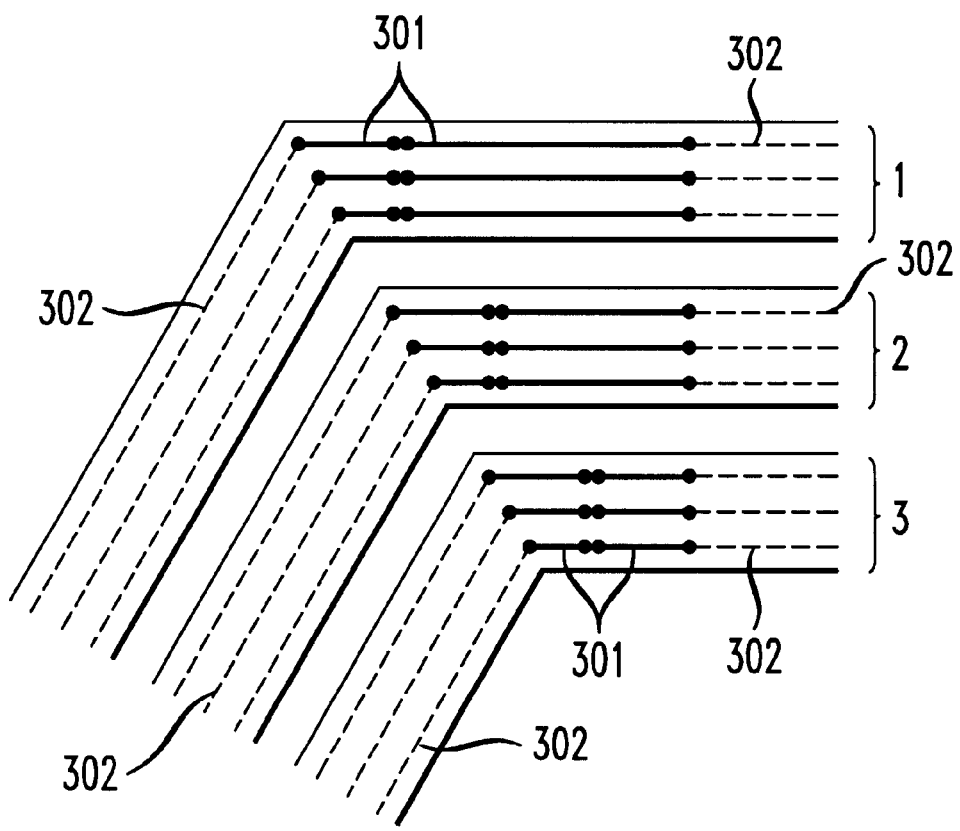
FIG. 3 is a graphical representation illustrating test elements relative to lines of charge/current in a section of the inductor of FIG. 2.

FIGS. 2A through 2C show, in simplified form, an inductor 200 to be fabricated from circuit metalizations, as well as, the cross section of the metalization paths in the inductor. FIG. 2A shows three (3) sub units 1, 2 and 3 of an integrated circuit inductor as shown in FIGS. 2B and 2C. The uppermost metal 201 in each of the sub units is 3 μm thick, while the lower metals 202 and 203 are each 0.5 μm thick. The sub units 1, 2 and 3 form a portion of the overall integrated circuit inductor 200, which is fabricated on substrate 204. FIGS. 2B and 2C graphically illustrate overall inductor 200 including the representative sub units 1, 2 and 3. Note the high-lighted portions illustrating sub units 1, 2 and 3 in FIGS. 2B and 2C, and that the sub units have been partitioned into smaller sub elements as indicated, for example, by the cross hatching in sub unit 3.

FIG. 3 is a graphical representation illustrating test elements relative to lines of charge/current in a section of the inductor of FIG. 2. Shown are test elements 301, which are in parallel alignment relative the lines of current/charge 302 on a sub unit of inductor 100. Specifically, test elements 301 are in solid outline and delineated at each end the solid line by a large dot, and the lines of charge/current 302 are in dotted outline. In FIG. 3, the test elements 301 and lines of charge/current 302 are shown relative to the groups of sub units 1, 2 and 3 of inductor 200.

Figure 4:
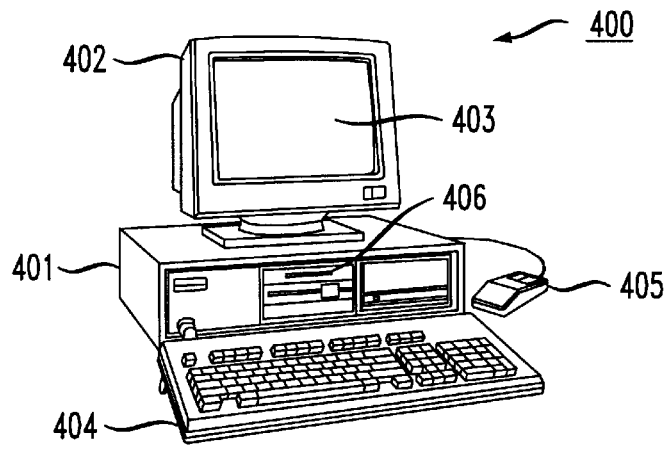
FIG. 4 shows, in simplified form, simulation apparatus including an embodiment of the invention.

FIG. 4 shows, in simplified form, simulation apparatus including an embodiment of the invention. Thus, shown is computer system 400 which may be, for example, a workstation of a type well known in the art, including a central processor, system memory, hard disk and the like (not shown) but housed in cabinet 401. Also included are monitor 402, display unit 403, keyboard 404 and pointing device, i.e., mouse 405. Cabinet 401 also houses a CD-ROM drive 406. The hard disk and system memory are employed in well known fashion to store and retrieve software programs incorporating code for effecting an embodiment of the invention. Additionally, cabinet 401 may also house a floppy disk drive (not shown).

Figure 5:
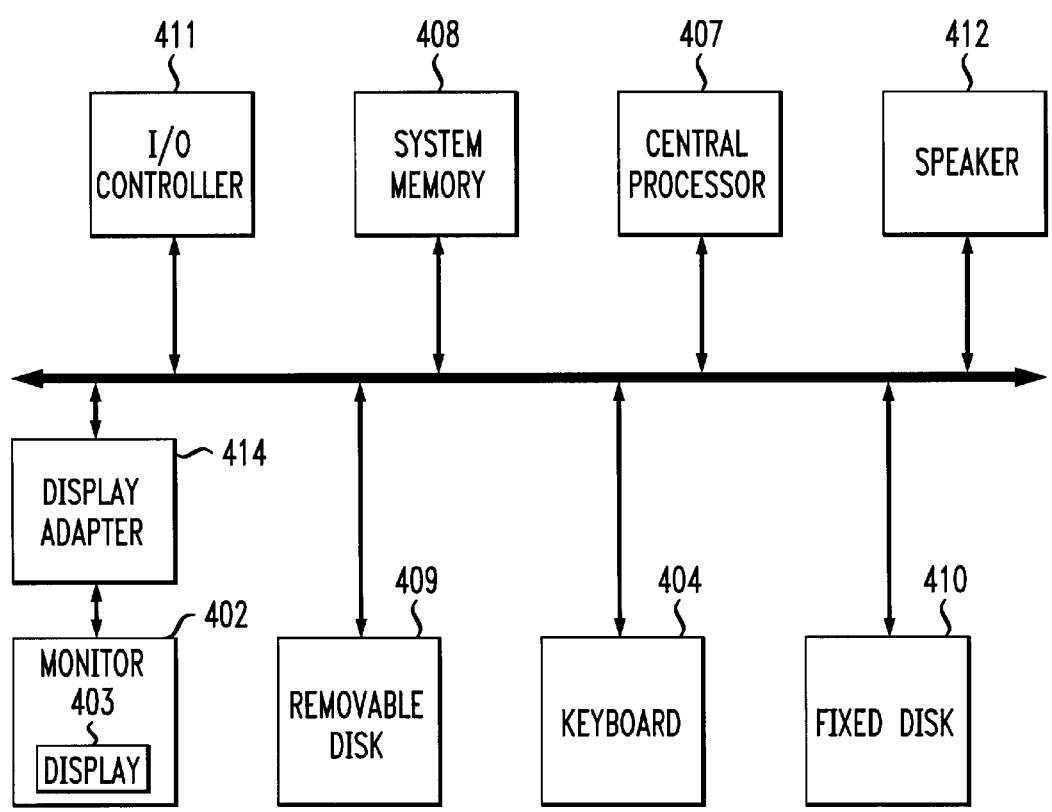
FIG. 5 shows, in simplified block diagram form, details of the apparatus of FIG. 4.

FIG. 5 shows, in simplified block diagram form, details of the apparatus of FIG. 4. Thus, shown is computer system 400 including monitor 402 including display unit 403, display adapter 414, keyboard 404, mouse 405, central processor 407, system memory 408, removable disk drive 409, hard disk drive 410, I/O controller 411 and speaker 412 all interconnected via bus 413. Indeed, FIG. 5 illustrates but one arrangement for implementing an embodiment of the invention and other similar arrangements may be employed to equally practice one or more embodiments of the invention.

Figure 6:
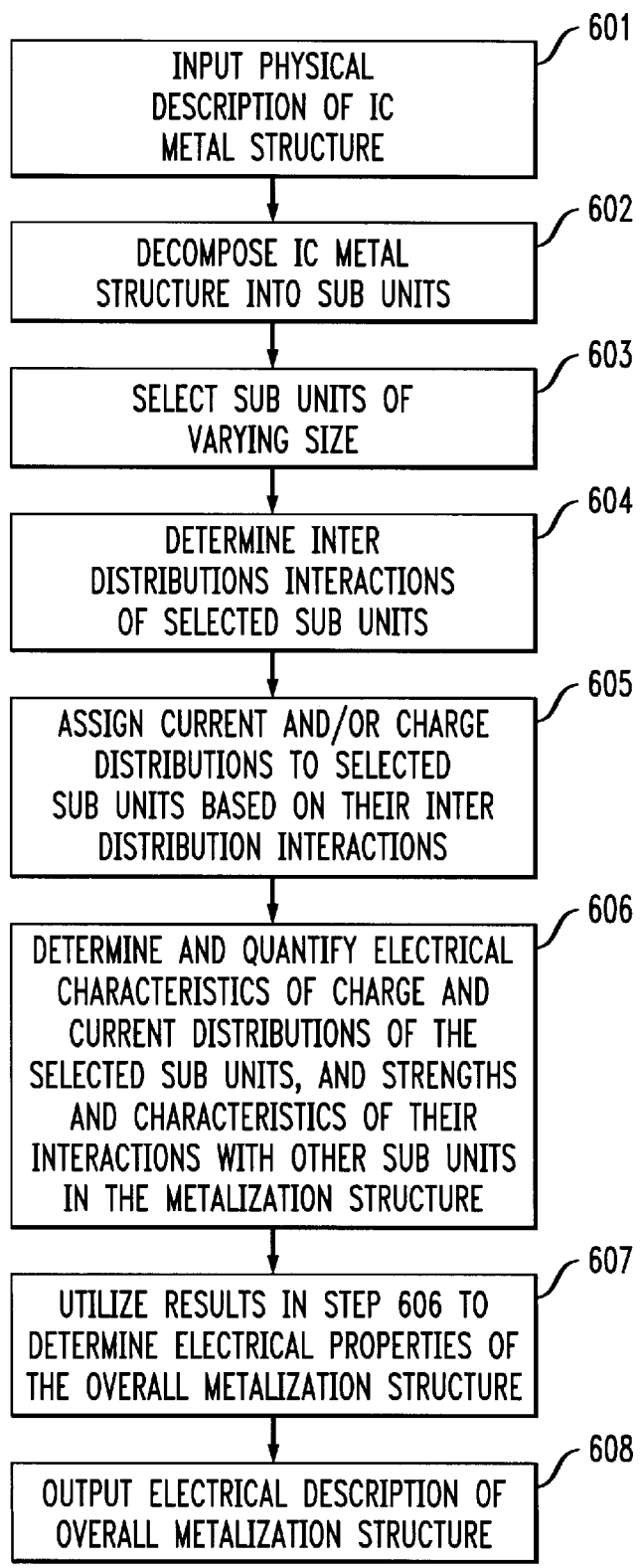
FIG. 6 is a flowchart illustrating steps in one embodiment of a simulation process including an embodiment of the invention.

FIG. 6 is a flow chart illustrating steps in one embodiment of a simulation process including an embodiment of the invention. Specifically, a variable interaction range meshing, i.e., multipole, decomposition process is described that is advantageously employed to model the charge and current distributions of metalization structures. These distributions are then employed to obtain electrical characteristics of an overall physical metalization structure to be fabricated. The process, in this example, is started in step 601 by inputting the physical description of a metal structure, for example, one to be fabricated on an integrated circuit substrate. Then in step 602 the metal structure is decomposed into metalization sub units. Step 603 merely selects sub units to be employed in determining the electrical characteristics of the overall physical metalization structure to be fabricated. Indeed, in some applications steps 602 and 603 may not be employed and only the metalization structure will be used in determining its characteristics. Step 604 causes a determination to be made of inter distribution interactions of the sub units from step 603. Again, only the overall metalization structure may be used for this purpose. Step 604 is realized by employing Equations 17, 22 and 23, as described above. Specifically, a current distribution, for example, like $f_n$ in Equation 22 is put on the sub unit. Then, Equation 23 is employed to obtain field E. With field E in the vicinity of the sub unit Equation 17 is then employed to obtain the interactions. Step 605 causes the assignment of current and/or charge distributions to the sub units based on their interactions. This is realized by employing Equation 17. Then, step 606 determines and quantifies the electrical characteristics of charge and current distributions of the sub units, and strengths and characteristics of their interactions with other sub units in the metalization structure. This is realized by using Equations 16 through 19 to make a self-consistent determination of the characteristics of the sub unit. Note that the simultaneous solution of Equations 16 and 17 along with the constraints of Equations 18 and 19 allow the determination of the field dependent current distribution of the particular metalization sub unit. It is noted that term $a_n$ in Equation 23 can cause changes in the characteristics of the sub unit. Then, step 607 utilizes the results of step 606 to determine the electrical characteristics of the overall physical metalization structure to be fabricated. To this end, Equations 16, 17, 20, 22–24 and 25 are employed. Then, a self-consistent determination of the characteristics via Equation 25 is made of the overall metalization structure and a simultaneous self-consistent determination via Equations 17, 22 and 23 of the characteristics of the overall metalization structure. Finally, step 608 causes the electrical description of the overall metalization structure to be supplied as an output. Also see an article entitled "Analysis, Design, and Optimization of Spiral Inductors and Transformers for Si RF IC's", authored by A. M. Niknejad et al., *IEEE Journal Of Solid-State Circuits,* Vol. 33, No. 10, pages 1470–1481, October 1998, that discloses a computer-aided-design tool that may use the parameters, including the charge and/or current distributions, generated by the instant invention to generate the electrical characteristics of overall metalization structures, for example, inductors, in integrated circuits.

The above-described methods and apparatus are, of course, merely illustrative of the principles of the invention. Indeed, numerous other methods or apparatus may be devised by those skilled in the art without departing from the spirit and scope of the invention.

What is claimed is:

1. A method for use in computer aided simulation apparatus to model metalization structures in electrical circuits comprising the steps of:

generating charge and/or current distributions from a source of current distribution on a metalization structure;

determining interactions between metalization structures based on underlying characteristics of said charge and/or current distributions that generated said interactions;

obtaining the charge and/or current distributions that generated said interactions;

decomposing said interactions into a number of long-range interactions and a number of short-range interactions; and to generating, in accordance with prescribed criteria based on said obtained charge and/or current distributions and their prescribed relationships with said number of long-range interactions and said number of short-range interactions, electrical characteristics including at least impedance and admittance values of an overall physical metalization structure, for example, an inductor, interconnect or the like, to be fabricated.

2. The method as defined in claim 1 further including a step of minimizing said number of long range interactions by employing a variable interaction range meshing process.

3. A method for use in computer aided simulation apparatus to model metalization structures in electrical circuits comprising the steps of:

generating charge and/or current distributions from a source of current distribution on a metalization structure;

determining interactions between metalization structures based on underlying characteristics of said charge and/or current distributions that generated said interactions;

obtaining the charge and/or current distributions that generated said interactions;

decomposing said interactions into a number of long-range interactions and a number of short-range interactions;

minimizing said number of long range interactions by decomposing inter metalization interaction in a prescribed manner by performing a variable interaction range meshing process on said long-range interactions; and generating, in accordance with prescribed criteria based on said obtained charge and/or current distributions and their prescribed relationships with said number of long-range interactions and said number of short-range interactions, electrical characteristics including at least impedance and admittance values of an overall physical metalization structure, for example, an inductor, interconnect or the like, to be fabricated.

4. The method as defined in claim 3 wherein said variable interaction range meshing process includes performing a multipole expansion on said long-range interactions.

5. The method as defined in claim 4 wherein said long range interactions arise because of current distributions on said metalization structure.

6. The method as defined in claim 3 wherein said step of minimizing further includes providing shielding to shunt current to ground potential thereby minimizing said long range interactions caused by charge distributions in said metalization sub units.

7. The method as defined in claim 3 further including a step of partitioning said metalization structure to be fabricated into metalization sub units and wherein said step of determining interactions determines interactions between said metalization sub units.

8. A method for use in computer simulation apparatus to model metalization structures in electrical circuits comprising the steps of:

partitioning said metalization structure to be fabricated into metalization sub units;

generating charge and/or current distributions from a source of current distribution on a metalization structure to be fabricated;

determining interactions between metalization structures based on underlying characteristics of said charge and/or current distributions that generated said interactions, said step of determining interactions determines interactions between said metalization sub units;

obtaining the charge and/or current distributions that generated said interactions;

decomposing said interactions into a number of long-range interactions and a number of short-range interactions;

minimizing said number of long range interactions by decomposing inter metalization interaction in a prescribed manner by performing a variable interaction range meshing process on said long-range interactions of said metalization sub units; and generating, in accordance with prescribed criteria based on said obtained charge and/or current distributions and their prescribed relationships with said number of long-range interactions and said number of short-range interactions, electrical characteristics including at least impedance and admittance values of an overall physical metalization structure, for example, an inductor, interconnect or the like, to be fabricated.

9. The method as defined in claim 8 wherein said variable interaction range meshing process includes a step of performing a multipole expansion on said long-range interactions of said metalization sub units.

10. The method as defined in claim 9 wherein said long range interactions arise because of current distributions on said metalization structure.

11. The method as defined in claim 8 wherein said step of minimizing further includes providing shielding to shunt current to ground potential thereby minimizing said long range interactions caused by charge distributions in said metalization sub units.

12. Apparatus for use in computer aided simulation apparatus to model metalization structures in electrical circuits comprising:

means for generating charge and/or current distributions from a source of current distribution on a metalization structure;

means for determining interactions between metalization structures based on underlying characteristics of said charge and/or current distributions that generated said interactions;

means for obtaining the charge and/or current distributions that generated said interactions;

means for decomposing said interactions into a number of long-range interactions and a number of short-range interactions; and means for generating, in accordance with prescribed criteria based on said obtained charge and/or current distributions and their prescribed relationships with said number of long-range interactions and said number of short-range interactions, electrical characteristics including at least impedance and admittance values of an overall physical metalization structure, for example, an inductor, interconnect or the like, to be fabricated.

13. The invention as defined in claim 12 further including means for minimizing said number of long range interactions by employing a variable interaction range meshing process.

14. Apparatus for use in computer aided simulation apparatus to model metalization structures in electrical circuits comprising:

means for generating charge and/or current distributions from a source of current distribution on a metalization structure;

means for determining interactions between metalization structures based on underlying characteristics of said charge and/or current distributions that generated said interactions;

means for obtaining the charge and/or current distributions that generated said interactions;

means for decomposing said interactions into a number of long-range interactions and a number of short-range interactions;

means for minimizing said number of long range interactions by decomposing inter metalization interaction in a prescribed manner by performing a variable interaction range meshing process on said long range interactions; and means for generating, in accordance with prescribed criteria based on said obtained charge and/or current distributions and their prescribed relationships with said number of long-range interactions and said number of short-range interactions, electrical characteristics including at least impedance and admittance values of an overall physical metalization structure, for example, an inductor, interconnect or the like, to be fabricated.

15. The invention as defined in claim 14 wherein said variable interaction range meshing process includes performing a multipole expansion on said long range interactions.

16. The invention as defined in claim 15 wherein said long range interactions arise because of current distributions on said metalization structure.

17. The invention as defined in claim 14 wherein said means for minimizing further includes means for providing shielding to shunt current to ground potential thereby minimizing said long range interactions caused by charge distributions in said metalization structure.

18. The invention as defined in claim 14 further including means for partitioning said metalization structure to be fabricated into metalization sub units and wherein said means for determining interactions determines interactions between said metalization sub units.

19. Apparatus for use in computer aided simulation apparatus to model metalization structures in electrical circuits comprising:

means for partitioning said metalization structure to be fabricated into metalization sub units;

means for generating charge and/or current distributions from a source of current distribution on a metalization structure to be fabricated;

means for determining interactions between metalization structures based on underlying characteristics of said charge and/or current distributions that generated said interactions, said step of determining interactions determines interactions between said metalization sub units;

means for obtaining the charge and/or current distributions that generated said interactions;

means for decomposing said interactions into a number of long-range interactions and a number of short-range interactions;

means for minimizing said number of long range interactions by decomposing inter metalization interaction in a prescribed manner by performing a variable interaction range meshing process on said long range interactions of said metalization sub units; and means for generating, in accordance with prescribed criteria based on said obtained charge and/or current distributions and their prescribed relationships with said number of long-range interactions and said number of short-range interactions, electrical characteristics including at least impedance and admittance values of an overall physical metalization structure, for example, an inductor, interconnect or the like, to be fabricated.

20. The invention as defined in claim 19 wherein said variable interaction range meshing process includes performing a multipole expansion on said long range interactions of said metalization sub units.

21. The invention as defined in claim 20 wherein said long range interactions arise because of current distributions on said metalization structure.

22. The invention as defined in claim 20 wherein said means for minimizing further includes means for providing shielding to shunt current to ground potential thereby minimizing said long range interactions caused by charge distributions in said metalization sub units.

23. Apparatus for use in computer aided simulation apparatus to model metalization structures in electrical circuits comprising:
  a first generator to generate charge and/or current distributions from a source of current distribution on a metalization structure;
  a first determinator to determine interactions between metalization structures based on underlying characteristics of said charge and/or current distributions that generated said interactions;
  a detector to detect the charge and/or current distributions that generated said interactions;
  a decomposer to decompose said interactions into a number of long-range interactions and a number of short-range interactions; and
  a second generator to generate, in accordance with prescribed criteria based on said obtained charge and/or current distributions and their prescribed relationships with said number of long-range interactions and said number of short-range interactions, electrical characteristics including at least impedance and admittance values of an overall physical metalization structure, for example, an inductor, interconnect or the like, to be fabricated.

24. The invention as defined in claim 23 further including a minimizer to minimize said number of long range interactions by employing a variable interaction range meshing process.

25. Apparatus for use in computer aided simulation apparatus to model metalization structures in electrical circuits comprising:
  a first generator to generate charge and/or current distributions from a source of current distribution on a metalization structure;
  a first determinator to determine interactions between metalization structures based on underlying characteristics of said charge and/or current distributions that generated said interactions;
  a detector to detect the charge and/or current distributions that generated said interactions;
  a decomposer to decompose said interactions into a number of long-range interactions and a number of short-range interactions;
  a minimizer to minimize the number of long-range interactions by decomposing inter metalization interactions in a prescribed manner by performing a variable interaction range meshing process on said long-range interactions; and
  a second generator to generate, in accordance with prescribed criteria based on said obtained charge and/or current distributions and their prescribed relationships with said number of long-range interactions and said number of short-range interactions, electrical characteristics including at least impedance and admittance values of an overall physical metalization structure, for example, an inductor, interconnect or the like, to be fabricated.

26. The invention as defined in claim 25 wherein said variable interaction range meshing process includes performing a multipole expansion on said long-range interactions.

27. The invention as defined in claim 26 wherein said long range interactions arise because of current distributions on said metalization structure.

28. The invention as defined in claim 25 wherein said minimizer further includes apparatus for providing shielding to shunt current to ground potential thereby minimizing said long range interactions caused by charge distributions in said metalization structure.

29. The invention as defined in claim 25 further including a partitioner to partition said metalization structure to be fabricated into metalization sub units and wherein said first determinator determines interactions between said metalization sub units.

30. Apparatus for use in computer aided simulation apparatus to model metalization structures in electrical circuits comprising:
  a partitioner to partition said metalization structure to be fabricated into metalization sub units;
  a first generator to generate charge and/or current distributions from a source of current distribution on a metalization structure;
  a first determinator to determine interactions between metalization structures based on underlying characteristics of said charge and/or current distributions that generated said interactions;
  a detector to detect the charge and/or current distributions that generated said interactions;
  a decomposer to decompose said interactions into a number of long-range interactions and a number of short-range interactions;
  a minimizer to minimize the number of long-range interactions by decomposing inter metalization interactions in a prescribed manner by performing a variable interaction range meshing process on said long-range interactions of said metalization sub units; and
  a second generator to generate, in accordance with prescribed criteria based on said obtained charge and/or current distributions and their prescribed relationships with said number of long-range interactions and said number of short-range interactions, electrical characteristics including at least impedance and admittance values of an overall physical metalization structure, for example, an inductor, interconnect or the like, to be fabricated.

31. The invention as defined in claim 30 wherein said variable interaction range meshing process includes performing a multipole expansion on said long-range interactions of said metalization sub units.

32. The invention as defined in claim 31 wherein said long range interactions arise because of current distributions on said metalization structure.

33. The invention as defined in claim 30 wherein said minimizer further includes apparatus for providing shielding to shunt current to ground potential thereby minimizing said long range interactions caused by charge distributions in said metalization sub units.

* * * * *